US010923327B2

(12) United States Patent
Li et al.

(10) Patent No.: US 10,923,327 B2
(45) Date of Patent: Feb. 16, 2021

(54) CHAMBER LINER

(71) Applicant: Applied Materials, Inc., Santa Clara, CA (US)

(72) Inventors: Jianheng Li, Santa Clara, CA (US); Lai Zhao, Campbell, CA (US); Robin L. Tiner, Santa Cruz, CA (US); Allen K. Lau, Cupertino, CA (US); Gaku Furuta, Sunnyvale, CA (US); Soo Young Choi, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 211 days.

(21) Appl. No.: 16/052,304

(22) Filed: Aug. 1, 2018

(65) Prior Publication Data
US 2020/0043706 A1  Feb. 6, 2020

(51) Int. Cl.
*H01J 37/32* (2006.01)
*C23C 16/505* (2006.01)

(52) U.S. Cl.
CPC ...... *H01J 37/32477* (2013.01); *C23C 16/505* (2013.01); *H01J 37/3244* (2013.01); *H01J 37/32715* (2013.01); *H01J 37/32082* (2013.01); *H01J 2237/3321* (2013.01)

(58) Field of Classification Search
CPC ........... H01J 37/32477; H01J 37/32715; H01J 37/3244; H01J 2237/3321; H01J 37/32082; C23C 16/505
USPC ....................................... 118/715; 156/345.1
See application file for complete search history.

(56) References Cited

U.S. PATENT DOCUMENTS

| 5,366,585 A | 11/1994 | Robertson et al. |
| 5,885,356 A | 3/1999 | Zhao et al. |
| 8,281,739 B2 | 10/2012 | Tiner et al. |
| 9,653,267 B2 * | 5/2017 | Carducci ........... H01J 37/32495 |
| 2004/0072426 A1 * | 4/2004 | Jung ................ H01J 37/32477 438/689 |
| 2004/0137147 A1 * | 7/2004 | O'Donnell .......... C23C 16/4404 427/255.38 |

(Continued)

FOREIGN PATENT DOCUMENTS

| TW | I250219 B | 3/2006 |
| TW | I312012 B | 7/2009 |

(Continued)

OTHER PUBLICATIONS

International Search Report and Written Opinion dated Nov. 11, 2019 for Application No. PCT/US/2019/042298.

(Continued)

*Primary Examiner* — Rudy Zervigon
(74) *Attorney, Agent, or Firm* — Patterson + Sheridan LLP

(57) ABSTRACT

Embodiments described herein generally relate to apparatus and methods for processing a substrate utilizing a high radio frequency (RF) power. The high RF power enables deposition of films on the substrate with more desirable properties. A first plurality of insulating members is disposed on a plurality of brackets and extends laterally inward from a chamber body. A second plurality of insulating members is disposed on the chamber body and extends from the first plurality of insulating members to a support surface of the chamber body. The insulating members reduce the occurrence of arcing between the plasma and the chamber body.

20 Claims, 3 Drawing Sheets

(56) References Cited

U.S. PATENT DOCUMENTS

| | | | |
|---|---|---|---|
| 2005/0000432 A1* | 1/2005 | Keller | C23C 16/5096 |
| | | | 118/715 |
| 2005/0183827 A1* | 8/2005 | White | H01J 37/3244 |
| | | | 156/345.34 |
| 2008/0118663 A1 | 5/2008 | Choi et al. | |
| 2013/0228124 A1 | 9/2013 | Furuta et al. | |
| 2015/0059981 A1* | 3/2015 | Huston | C23C 16/46 |
| | | | 156/345.52 |
| 2017/0256383 A1 | 9/2017 | Liao et al. | |

FOREIGN PATENT DOCUMENTS

| | | |
|---|---|---|
| TW | I405247 B | 8/2013 |
| WO | 2009075544 A2 | 6/2009 |
| WO | 2011146108 A2 | 11/2011 |
| WO | 2017165016 A1 | 9/2017 |

OTHER PUBLICATIONS

Taiwan Office Action dated Oct. 16, 2020 for Application No. 108126359.

\* cited by examiner

CHAMBER LINER

BACKGROUND

Field

Embodiments disclosed herein generally relate to the field of semiconductor manufacturing equipment, and more specifically, an apparatus for reducing arcing of a plasma during a manufacturing process.

Description of the Related Art

Conventional process chambers for plasma enhanced chemical vapor deposition (PECVD) processing lack suitable apparatus for utilizing high radio frequency (RF) power. For example, conventional process chambers limit a maximum RF power to about 4 kW. Using an RF power greater than about 5 kW causes flickering or arcing to occur in the plasma. However, a higher RF power (e.g., greater than about 5 kW) enables deposition of films with desirable properties.

Thus, what is needed in the art is improved apparatus for process chambers to reduce arcing.

SUMMARY

In one embodiment, an apparatus is provided which includes a chamber body defining a process volume. A support surface is formed in the chamber body. A lid is coupled to the chamber body and a showerhead is disposed within the process volume. A plurality of brackets is coupled to and extends laterally inward from the chamber body. A support pedestal is disposed within the process volume opposite the showerhead. A first plurality of insulating members is disposed on the plurality of brackets. Each insulating member of the first plurality of insulating members extends laterally inward from the chamber body. A second plurality of insulating members is disposed on the chamber body. Each insulating member of the second plurality of insulating members extends from the first plurality of insulating members to the support surface of the chamber body.

In another embodiment, an apparatus is provided which includes a chamber body defining a process volume therein. The chamber body has a bottom and a support surface opposite the bottom. A first sidewall extends from the bottom to the support surface. A second sidewall extends from the bottom to the support surface opposite the first sidewall. A third sidewall extends from the bottom to the support surface between the first sidewall and the second sidewall. A fourth sidewall extends from the bottom to the support surface between the first sidewall and the second sidewall. The fourth sidewall is opposite the third sidewall. A support pedestal is disposed within the process volume. A showerhead is disposed within the process volume opposite the support pedestal. A first bracket is coupled to the first sidewall between the bottom and the support surface. A second bracket is coupled to the second sidewall and is substantially coplanar with the first bracket. A third bracket is coupled to the third sidewall and is substantially coplanar with the first bracket and the second bracket. A fourth bracket is coupled to the fourth sidewall and is substantially coplanar with the first bracket, the second bracket, and the third bracket. An insulating member of a first plurality of insulating members is disposed on each of the first bracket, the second bracket, the third bracket, and the fourth bracket. A second plurality of insulating members extends from one of the first bracket, the second bracket, the third bracket, and the fourth bracket to the support surface of the chamber body.

In yet another embodiment, an apparatus is provided which includes a chamber body defining a process volume therein. The chamber body has a support surface, a first sidewall, a second sidewall opposite the first sidewall, a third sidewall between the first sidewall and the second sidewall, and a fourth sidewall between the first sidewall and the second sidewall. The fourth sidewall is opposite the third sidewall. Each sidewall forms a corner having a substantially right angle with an adjacent sidewall. A plurality of brackets is coupled to and extends laterally inward from the chamber body. A first plurality of insulating members is disposed on the plurality of brackets. A second plurality of insulating members is coupled to the chamber body. Each insulating member of the second plurality of insulating members extends from the first plurality of insulating members to the support surface. A third plurality of insulating members is coupled to the chamber body in each corner of the chamber body.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein generally relate to apparatus and methods for processing a substrate utilizing a high radio frequency (RF) power. The high RF power enables deposition of films on the substrate with more desirable properties. A first plurality of insulating members is disposed on a plurality of brackets and extends laterally inward from a chamber body. A second plurality of insulating members is disposed on the chamber body and extends from the first plurality of insulating members to a support surface of the chamber body. The insulating members reduce the occurrence of arcing between the plasma and the chamber body.

The processes and apparatus described herein can be used to deposit gate insulator silicon oxide (GISiO) films. GISiO films can be deposited using silane ($SiH_4$) and nitrous oxide ($N_2O$) or using tetraethyl orthosilicate (TEOS) ($Si(OC_2H_5)$ ₄) and oxygen (O₂). It is contemplated that other processes utilizing other materials may also benefit from the embodiments described herein.

Figure 1:
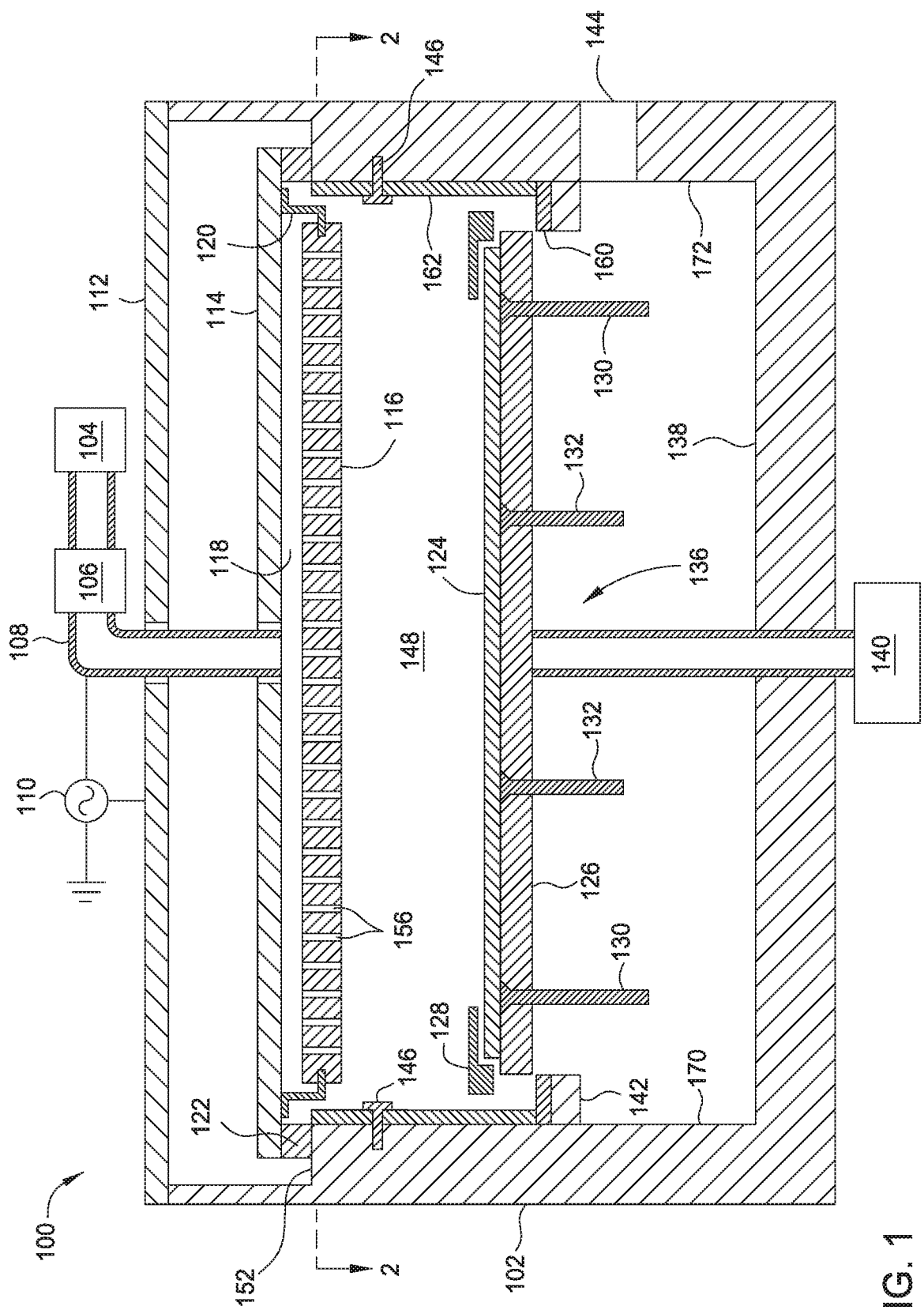
FIG. 1 illustrates a schematic side cross-sectional view of a process chamber according to one embodiment of the disclosure.

FIG. 1 illustrates a schematic side cross-sectional view of a process chamber 100 according to one embodiment of the disclosure. The process chamber 100 includes a chamber body 102 and a lid 112 coupled to the chamber body 102. The chamber body 102 has a bottom 138 and a first sidewall 170 substantially normal to and extending between the bottom 138 and the lid 112. A second sidewall 172 is disposed opposite the first sidewall 170. The second sidewall 172 is substantially parallel to the first sidewall 170 and extends between the bottom 138 and the lid 112. The bottom 138 is substantially normal to and extends between the first sidewall 170 and the second sidewall 172. Third and fourth sidewalls (described in detail with regard to FIG. 2) are parallel to one another and extend between the first sidewall 170 and the second sidewall 172. A slit valve opening 144 is formed through the second sidewall 172 of the chamber body 102.

The chamber body 102 and the lid 112 define a process volume 148 therein. A gas source 104 is in fluid communication with the process volume 148 via a conduit 108. The conduit 108 is fabricated from an electrically conductive material, such as aluminum or alloys thereof. A remote plasma source 106 is coupled to the conduit 108 between the gas source 104 and the process volume 148. A radio frequency (RF) power source 110 is coupled to the remote plasma source 106 to provide RF power which activates the process gases from the gas source 104. The RF power source 110 is electrically coupled to the lid 112 which provides an RF current return path from the chamber body 102 to the RF power source 110. The RF power source 110 generates an RF power between about 3 kW and about 20 kW, such as between about 12 kW and about 19 kW, for example about 18 kW. Between processing substrates, a cleaning gas may be provided to the remote plasma source 106 so that a remote plasma is generated and provided to clean components of the process chamber 100.

A support surface 152 is formed in the chamber body 102. The support surface 152 is formed in each sidewall of the chamber body, including the first sidewall 170 and the second sidewall 172 (and the third and fourth sidewalls). The support surface 152 is opposite the bottom 138 and is substantially normal to the first sidewall 170 and the second sidewall 172. A substrate support 136 is disposed within the process volume 148. The substrate support 136 supports a substrate 124 during processing. In one embodiment, the substrate support 136 is fabricated from a ceramic material. In another embodiment, the substrate support 136 is fabricated from a graphite material coated with a silicon containing material, such as a silicon carbide material.

The substrate support 136 is moveable within the process volume 148 via an actuator 140. For example, during processing, the substrate support 136 is in a raised position such that the substrate 124 is positioned above the slit valve opening 144. Upon completion of the processing, the actuator 140 moves the substrate support 136 to a lowered position such that the substrate support 136 is below the slit valve opening 144. The lowered position of the substrate support 136 enables transfer of a substrate 124 to or from the substrate support 136.

One or more lift pins 130, 132 are disposed through the substrate support 136. The one or more lift pins 130, 132 are different lengths to reduce bowing of the substrate 124 when the substrate 124 is elevated on the lift pins 130, 132. For example, one or more inner lift pins 132 are shorter than one or more outer lifts pins 130 that are disposed in the substrate support 136 laterally outward of the inner lift pins 132. Thus, when the substrate 124 is elevated on the lift pins 130, 132, an inner portion of the substrate 124 positioned on the inner lift pins 132 sags relative to an outer portion of the substrate 124 positioned on the outer lift pins 130.

A showerhead 116 is disposed within the process volume 148 opposite the substrate support 136. The showerhead 116 is coupled to a backing plate 114 via one or more supports 120. One or more isolators 122, such as an insulator and o-ring seal, electrically isolate the backing plate 114 from the chamber body. The one or more isolators 122 are disposed on the support surface 152 of the chamber body 102 and support the backing plate 114. In one embodiment, the one or more isolators 122 are fabricated from a dielectric material. A volume 118 is defined by the backing plate 114, the showerhead 116 opposite the backing plate 114, and the one or more supports 120. A plurality of passages 156 is formed through the showerhead 116. The volume 118 is in fluid communication with the process volume 148 via the plurality of passages 156.

One or more brackets 142 are disposed on and coupled to the first sidewall 170 and the second sidewall 172. The one or more brackets 142 extend laterally inward from the first sidewall 170 and the second sidewall 172. The plurality of brackets 142 are disposed on and extend from the first sidewall 170 and the second sidewall 172 between the slit valve opening 144 and the support surface 152 of the chamber body 102. In one embodiment, the one or more brackets 142 are fabricated from an electrically conductive material, such as an aluminum material or alloys thereof. Thus, the one or more brackets 142 are electrically connected to the sidewalls of the chamber body 102, including the first sidewall 170 and the second sidewall 172, such that an RF current can flow continuously from the one or more brackets 142 to the sidewalls 170, 172.

One or more first insulating members 160 are disposed on the one or more brackets 142. The first insulating members 160 extend laterally from the first sidewall 170 and the second sidewall 172. One or more second insulating members 162 are disposed on the first sidewall 170 and the second sidewall 172. The second insulating members 162 extend from the first insulating members 160 to the support surface 152 of the chamber body 102. In one embodiment, the second insulating members 162 are coupled to the sidewalls 170, 172 of the chamber body 102 by one or more ceramic fasteners 146. In one embodiment, the first insulating members 160 and the second insulating members 162 are fabricated from a ceramic material, such as aluminum oxide ($Al_2O_3$). In another embodiment, the first insulating members 160 and the second insulating members 162 are fabricated from a polymer material.

While illustrated as separate insulating members in FIG. 1, in one embodiment the first insulating members 160 and the second insulating members 162 may be a continuous insulating member disposed on both the one or more brackets 142 and the sidewalls 170, 172. During processing, it is desirable to utilize a high RF power to improve properties of a film deposited on the substrate 124. For example, using an RF power between about 3.5 kW and about 20 kW, for example, about 18 kW may produce a film with desirable film properties such as improved density, increased breakdown voltage, decreased leakage current, and a lower wet etch rate, due to higher ion energy and ion bombardment. Utilizing an RF power of about 18 kW results in an increased breakdown voltage from about 7.8 MV/cm to about 8.5 MV/cm for films deposited utilizing an RF power of about 5 kW.

While a higher RF power (e.g., greater than about 4.1 kW) improves the film properties, it also increases the occurrence of arcing in the process volume which damages the deposited film and the substrate 124. The first insulating members 160 disposed on the one or more brackets 142 substantially reduce arcing between the plasma in the process volume 148 and the one or more brackets 142. Similarly, the second insulating members 162 substantially reduce arcing between the plasma in the process volume 148 and the sidewalls of the chamber body 102, including the first sidewall 170 and the second sidewall 172. The one or more brackets 142 and the first insulating members 160 also help to confine the plasma in the process volume 148 between the showerhead 116 and the support pedestal 136.

To further reduce the occurrence of arcing, a pressure in the process volume 148 is increased as the RF power is increased. As the RF power is increased, the occurrence of arcing in the process volume 148 also increases. To reduce the occurrence of arcing, a pressure in the process volume 148 is increased. For example, the pressure in the process volume 148 may be increased from between about 650 mTorr and about 1000 mTorr to between about 1000 mTorr and about 2000 mTorr, for example between about 1100 mTorr and about 1600 mTorr, such as 1500 mTorr.

A shadow frame 128 is moveably disposed in the process volume 148. When the substrate support 136 is in the lowered position, the shadow frame 128 rests on the first insulating members 160 and is supported by the one or more brackets 142. As the substrate support 136 is elevated to the raised position, the shadow frame 128 is engaged by and rests on an outer edge of the substrate 124 and an outer edge of the substrate support 136. When the substrate support 136 is in the raised position, the shadow frame 128 is spaced apart from the first insulating members 160. The shadow frame 128 is configured to confine deposition of a source material to a desired portion of the substrate 124.

Figure 2:
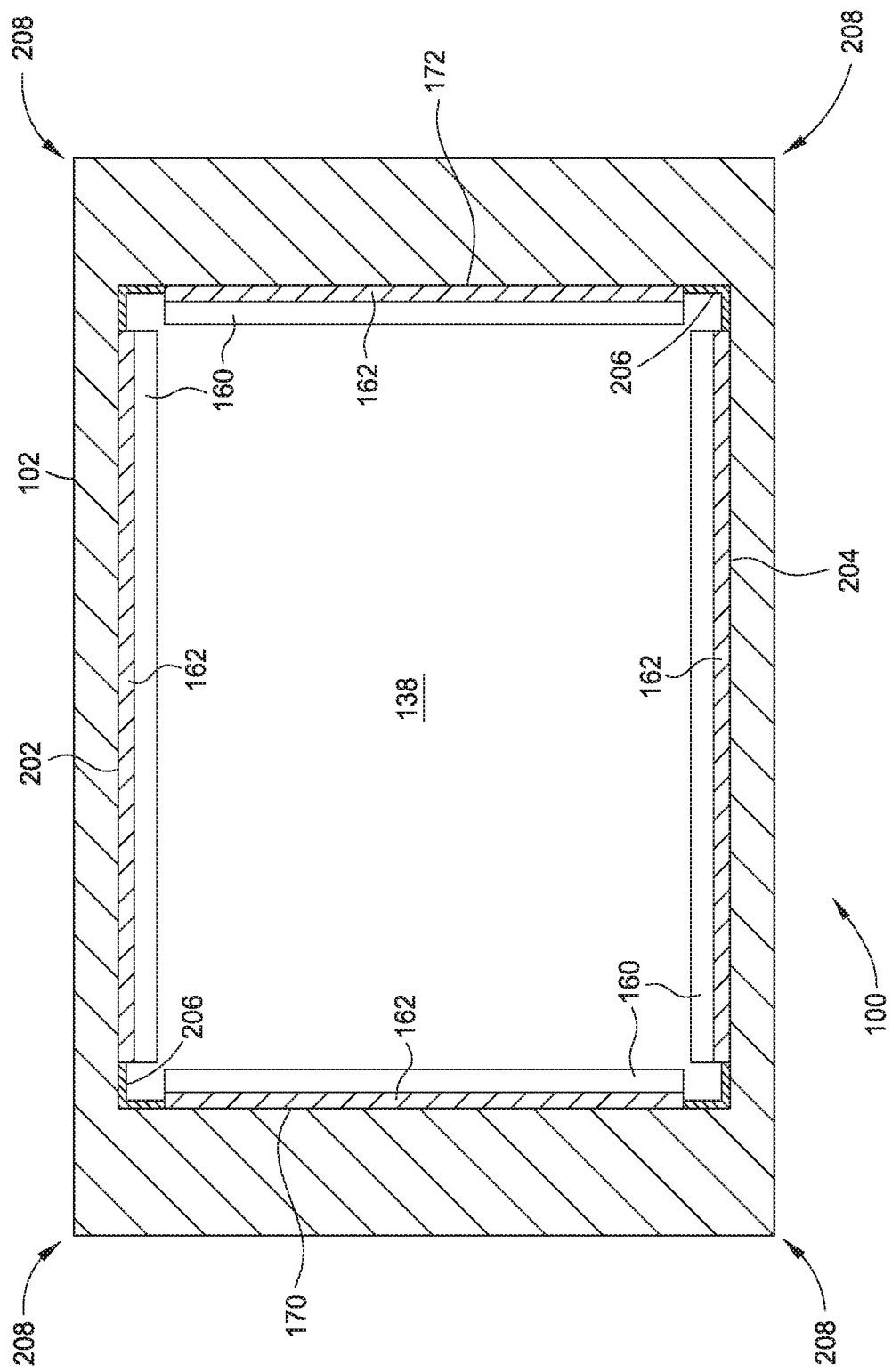
FIG. 2 illustrates a sectional plan view of a process chamber according to one embodiment of the disclosure.

FIG. 2 illustrates a sectional plan view of the process chamber 100 according to one embodiment of the disclosure. The chamber body 102 includes the first sidewall 170, the second sidewall 172, a third sidewall 202, and a fourth sidewall 204. The third sidewall 202 is substantially normal to and extends between the first sidewall 170 and the second sidewall 172. The fourth sidewall 204 is disposed opposite the third sidewall 202 and is substantially normal to and extends between the first sidewall 170 and the second sidewall 172. Each of the sidewalls 170, 172, 202, and 204 form a corner 208 having a substantially right angle with an adjacent sidewall 170, 172, 202, and 204.

One or more first insulating members 160 are coupled to and extend laterally inward from each of the sidewalls 170, 172, 202, and 204. Each of the first insulating members 160 are supported by a bracket that is coupled to and extends from each respective sidewall 170, 172, 202, and 204, such as the one or more brackets 142 illustrated in FIG. 1.

The second insulating members 162 are disposed on each sidewall 170, 172, 202, and 204 of the chamber body 102. One or more third insulating members 206 are disposed in each corner formed by the sidewalls 170, 172, 202, and 204. The third insulating members 206 are disposed on the sidewalls 170, 172, 202, and 204 and extend from the support surface 152 of the chamber body 102 to the bottom 138.

In one embodiment, a thickness of the second insulating members 162 is greater than a thickness of the third insulating members 206. In one embodiment, the third insulating members 206 are fabricated from a ceramic material, such as aluminum oxide ($Al_2O_3$). During processing, the third insulating members 206 help to reduce arcing between the plasma in the process volume 148 illustrated in FIG. 1 and the corners formed by the sidewalls 170, 172, 202, and 204.

Figure 3:
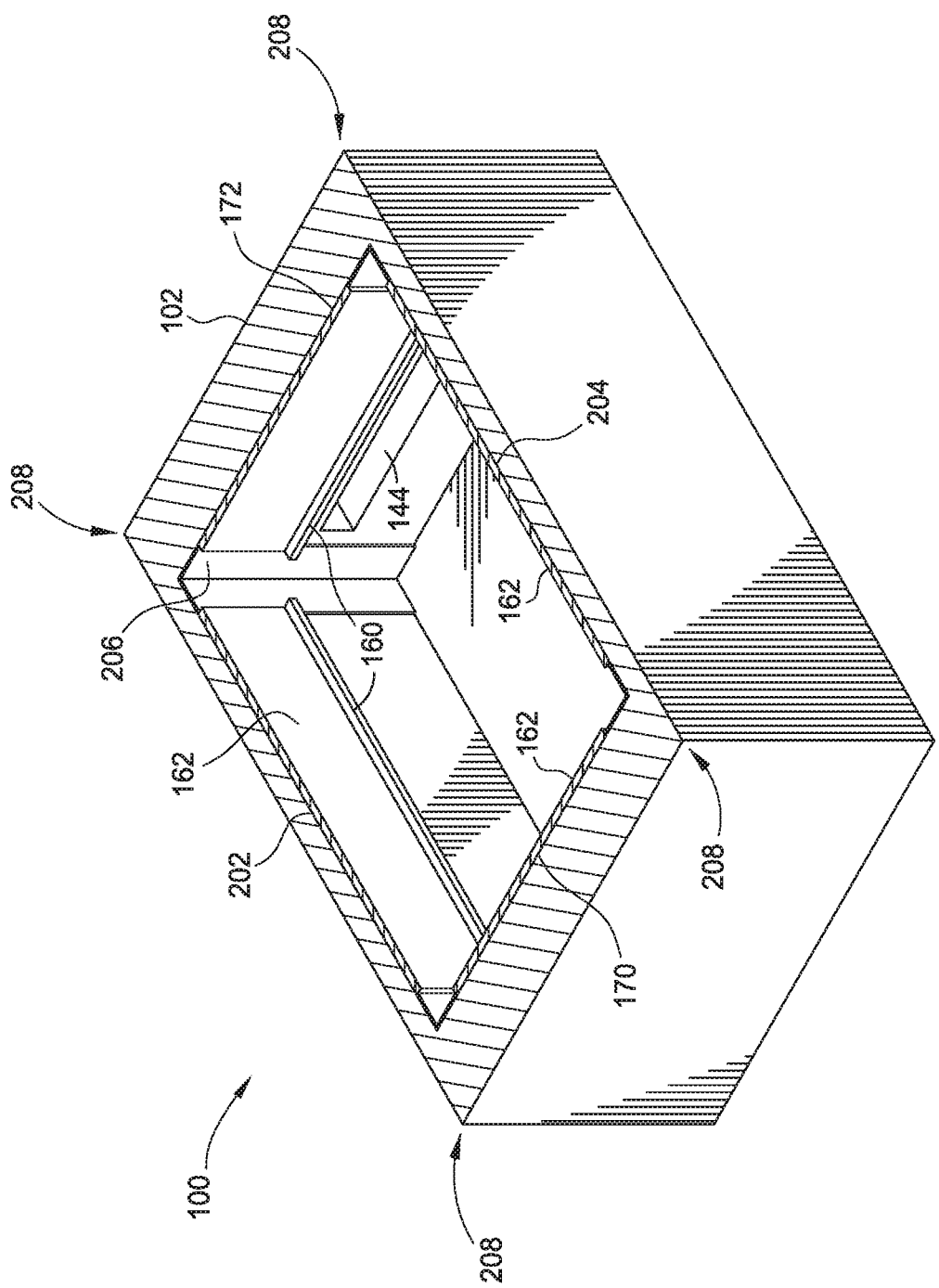
FIG. 3 illustrates a perspective view of a process chamber according to one embodiment of the disclosure.

FIG. 3 illustrates a perspective view of a process chamber 100 according to one embodiment of the disclosure. FIG. 3 more clearly illustrates the one or more third insulating members 206 disposed in the corners 208 formed by the sidewalls 170, 172, 202, and 204. The brackets 142, the first insulating members 160, the second insulating members 162, are disposed on the sidewalls 170, 172, 202, and 204 above the slit valve opening 144. The third insulating members extend between the support surface 152 and the bottom 138 of the chamber body 102. One or more brackets below the first insulating members 160, such as the one or more brackets 142 illustrated in FIG. 1, are omitted from FIG. 3 for purposes of clarity.

In summation, embodiments of the disclosure provide for improved arc protection and prevention for plasma processing apparatus. The insulating members described herein enable an increased RF power (e.g., about 15 kW) to be used during processing. In turn, the higher RF power enables films to be deposited which exhibit improved film properties, such as films which exhibit an increased breakdown voltage. The increased RF voltage further improves properties of a film deposited on the substrate such as improved density, decreased leakage current, and a lower wet etch rate. The insulating members also help to confine the plasma to the process volume between the showerhead and the support pedestal. The pressure in the process volume is also increased to reduce an occurrence of arcing in combination with the insulating members.

While the foregoing is directed to embodiments of the present disclosure, other and further embodiments of the disclosure may be devised without departing from the basic scope thereof, and the scope thereof is determined by the claims that follow.

What is claimed is:

1. An apparatus, comprising:
    a chamber body defining a process volume, the chamber body having a support surface and an inwardly facing surface formed therein;
    a lid coupled to the chamber body;
    a showerhead disposed within the process volume;
    a plurality of brackets coupled to and extending laterally inwardly from the chamber body;
    a support pedestal disposed within the process volume opposite the showerhead;
    a first plurality of electrically insulating members disposed on the plurality of brackets and extending laterally inward from the chamber body; and
    a second plurality of electrically insulating members disposed on the chamber body, each insulating member of the second plurality of electrically insulating members extending from one of the first plurality of electrically insulating members and along an inwardly facing surface of the chamber body to the intersection of the inwardly facing surface of the chamber body with the support surface of the chamber body, wherein the plurality of brackets and the first plurality of electrically insulating members comprise different materials, and
    a substrate support surface of the support pedestal is positionable both above and below the plurality of brackets.

2. The apparatus of claim 1, wherein each bracket of the plurality of brackets comprises an aluminum material.

3. The apparatus of claim 1, wherein each electrically insulating member of the first plurality of electrically insulating members and each electrically insulating member of the second plurality of electrically insulating members comprise a ceramic material.

4. The apparatus of claim 1, wherein each electrically insulating member of the first plurality of electrically insulating members and each electrically insulating member of the second plurality of electrically insulating members comprise a polymer material.

5. The apparatus of claim 1, wherein the second plurality of electrically insulating members is coupled to the chamber body via one or more ceramic fasteners.

6. The apparatus of claim 1, further comprising:
a slit valve opening formed through the chamber body, wherein the plurality of brackets is disposed on the chamber body between the slit valve opening and the support surface.

7. The apparatus of claim 1, wherein the plurality of brackets is positioned on the chamber body to modulate an RF return path within the process volume and
the chamber body includes an inwardly facing chamber wall, each of the plurality of brackets having a first bracket wall extending inwardly of the chamber body from the inwardly facing chamber wall, the first bracket wall facing the showerhead, and a second bracket wall extending inwardly of the chamber body from the inwardly facing chamber wall, the second bracket wall facing away from the showerhead.

8. An apparatus, comprising:
a chamber body defining a process volume, the chamber body having a bottom and a support surface opposite the bottom;
a first sidewall extending from the bottom to the support surface;
a second sidewall extending from the bottom to the support surface opposite the first sidewall;
a third sidewall extending from the bottom to the support surface between the first sidewall and the second sidewall;
a fourth sidewall extending from the bottom to the support surface between the first sidewall and the second sidewall opposite the third sidewall;
a support pedestal disposed within the process volume;
a showerhead disposed within the process volume opposite the support pedestal;
a first bracket coupled to, and extending inwardly of the process volume from, the first sidewall between the bottom and the support surface;
a second bracket coupled to, and extending inwardly of the process volume from, the second sidewall, the second bracket substantially coplanar with the first bracket;
a third bracket coupled to, and extending inwardly of the process volume from, the third sidewall, the third bracket substantially coplanar with the first bracket and the second bracket;
a fourth bracket coupled to, and extending inwardly of the process volume from, the fourth sidewall, the fourth bracket substantially coplanar with the first bracket, the second bracket, and the third bracket;
a first plurality of electrically insulating members, one of the first plurality of electrically insulating members disposed on each of the first bracket, the second bracket, the third bracket, and the fourth bracket; and
a second plurality of electrically insulating members, each electrically insulating member of the second plurality of electrically insulating members extending from one of the first bracket, the second bracket, the third bracket, and the fourth bracket to the support surface of the chamber body.

9. The apparatus of claim 8, wherein the first bracket, the second bracket, the third bracket, and the fourth bracket each comprise an aluminum material.

10. The apparatus of claim 8, wherein each electrically insulating member of the first plurality of electrically insulating members and each electrically insulating member of the second plurality of electrically insulating members comprise a ceramic material.

11. The apparatus of claim 8, wherein each electrically insulating member of the first plurality of electrically insulating members and each electrically insulating member of the second plurality of electrically insulating members comprise a polymer material.

12. The apparatus of claim 8, further comprising:
a slit valve opening formed in the chamber body, wherein the first plurality of electrically insulating members is coupled to the chamber body between the slit valve opening and the support surface.

13. The apparatus of claim 8, wherein the first bracket, the second bracket, the third bracket, and the fourth bracket are positioned on the chamber body to modulate an RF return path within the process volume.

14. An apparatus, comprising:
a chamber body defining a process volume therein, the chamber body having a support surface, a first sidewall, a second sidewall opposite the first sidewall, a third sidewall between the first sidewall and the second sidewall, and a fourth sidewall between the first sidewall and the second sidewall opposite the third sidewall, each sidewall forming a corner having a substantially right angle with an adjacent sidewall;
a plurality of brackets coupled to and extending laterally inward from the chamber body;
a first plurality of electrically insulating members disposed on the plurality of brackets;
a second plurality of electrically insulating members coupled to the chamber body, each insulating member of the second plurality of insulating members extending from the first plurality of insulating members to the support surface; and
a third plurality of electrically insulating members coupled to the chamber body in each corner of the chamber body,
wherein at least portions of the first plurality of electrically insulating members and the second plurality of electrically insulating members bound a portion of the process volume, and the second plurality of electrically insulating members directly contacting the chamber body, and
wherein a substrate support surface of a substrate support disposed in the processing volume is positionable above the plurality of brackets.

15. The apparatus of claim 14, wherein each bracket of the plurality of brackets comprises an aluminum material.

16. The apparatus of claim 14, wherein each electrically insulating member of the first plurality of electrically insulating members, the second plurality of electrically insulating members, and the third plurality of electrically insulating members comprise a ceramic material.

17. The apparatus of claim 14, wherein each insulating member of the first plurality of electrically insulating members, the second plurality of electrically insulating members, and the third plurality of electrically insulating members comprise a polymer material.

18. The apparatus of claim 14, wherein the second plurality of electrically insulating members is coupled to the chamber body via one or more ceramic fasteners.

19. The apparatus of claim 14, further comprising:
a slit valve opening formed through the chamber body, wherein the plurality of brackets is disposed between the slit valve opening and the support surface.

20. The apparatus of claim 14, wherein the plurality of brackets is positioned on the chamber body to modulate an RF return path within the process volume.

* * * * *